(12) United States Patent
Inoue et al.

(10) Patent No.: US 6,462,282 B1
(45) Date of Patent: *Oct. 8, 2002

(54) CIRCUIT BOARD FOR MOUNTING BARE CHIP

(75) Inventors: Yasushi Inoue; Masakazu Sugimoto; Megumu Nagasawa; Kei Nakamura, all of Osaka (JP)

(73) Assignee: Nitto Denko Corporation, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/338,659

(22) Filed: Jun. 23, 1999

(30) Foreign Application Priority Data

Jun. 23, 1998 (JP) .............................................. 10-176422

(51) Int. Cl.⁷ .................................................. H05K 1/16
(52) U.S. Cl. ........................................ 174/260; 174/261
(58) Field of Search ................................. 174/263, 261, 174/260, 255; 156/233, 230, 379.7; 442/232, 378; 361/780

(56) References Cited

U.S. PATENT DOCUMENTS 3,613,230 A * 10/1971 Griff ............................ 29/624
5,586,011 A * 12/1996 Alexander .................. 361/818
6,006,428 A * 12/1999 Feilchenfeld et al. ......... 29/852

OTHER PUBLICATIONS

Pan–Pacific Electronics Symposium published material, Feb. 13, 1998.

* cited by examiner

Primary Examiner—Jeffrey Gaffin
Assistant Examiner—Jeremy Norris
(74) Attorney, Agent, or Firm—Sughrue, Mion, Zinn Macpeak & Seas, PLLC (57) ABSTRACT

A circuit board for mounting a bare chip in the form of a flip chip. A metallic foil for protecting circuits in a state insulated therefrom is arranged in an area where the bare chip is located.

22 Claims, 5 Drawing Sheets

CIRCUIT BOARD FOR MOUNTING BARE CHIP

BACKGROUND OF THE INVENTION

1. Field of the Invention

The present invention relates to a circuit board for mounting a bare chip in the form of a flip chip.

The present application is based on Japanese Patent Application No. Hei. 10-176422, which is incorporated herein by reference.

2. Description of the Related Art

With an development of downsizing or high-performance of an electronic appliance in recent years, a semiconductor device constituting the electronic appliance and a multilayer printed wiring board for mounting or packaging it have been demanded to realize downsizing/low-profiling, high performance and high reliability. In order to satisfy such a demand, the type of a package has been shifted from a pin-insertion type package to surface-mounting package. Recently, a flip-chip packaging technique has been developed which directly mounts a bare semiconductor element (bare chip) not packaged on a printed wiring board.

On the other hand, in flip-chip mounting, a Si chip having a thermal expansion coefficient of 3–4 ppm/° C. is directly bonded onto a printed wiring board having a thermal expansion coefficient of 10–20 ppm/° C. through an adhesive. Therefore, stress is generated at a connecting portion owing to a difference in the thermal expansion coefficient therebetween. This reduces reliability of connection. Specifically, owing to the stress due to the difference in the thermal expansion coefficient, cracks arise in the adhesive to lower humidity resistance and break the connecting portion. Then, in order to relax such stress, attempts for optimizing various properties of the adhesive to diffuse the stress have been made.

However, the above technique cannot realize sufficient reliability of connection. If higher-density connection is required and an increased size of the silicon chip is expected in the future, the problem of stress produced owing to a difference in the thermal expansion coefficient between the silicon chip and the printed wiring board will be more serious.

Meanwhile, in the mounting process, after the silicon chip and printed wiring board are bonded to each other, a thermosetting under-fill material is poured in therebetween to seal the Si chip. The Si chip thus mounted is removed, and another good Si chip is mounted again (repairing step). In the repairing step, if the interlayer bonding force is low in the printed wiring board, the circuit was cut halfway, and peeling-off occurred between the adjacent layers.

SUMMARY OF THE INVENTION

An object of the present invention is to provide a circuit board for mounting a bare chip which can improve a repairability of the bare chip and reliability of connection therebetween.

In order to attain the above object, the circuit board for mounting a bare chip according to the present invention is structured as a circuit board for mounting a bare chip in the form of a flip chip, wherein a metallic foil for protecting a circuit in a state insulated therefrom is arranged in an area where the bare chip is located.

As a result of eager investigation for improving the repairability and connection reliability between a circuit board and a bare chip mounted thereon in the form of a flip chip, the inventors of the present invention have found that if a metallic foil for protecting circuits in a state insulated therefrom is arranged in an area where the bare chip is located, it protects the circuit on the circuit board so that the circuit is not cut halfway or damaged when the bare chip mounted once is repaired and peeling-off does not occur between adjacent layers when the circuit board includes plural layers. In addition, as described later, the inventors have found that use of the metallic foil having a low thermal expansion property (close to that of a silicon chip) can relax a difference in the thermal expansion coefficient between the bare chip and circuit board and minimize the stress occurring in a solder connection portion to implement the flip-chip mounting with a high degree of reliability.

In the present invention, where through-holes are formed at predetermined positions of the metallic foil and the inner periphery of each of the through-holes is covered with an insulating material, these through-holes can be used as a space for electrically connecting the bare chip to be mounted to the circuits located below the metallic foil (which is used to insert an electrode provided on the bare chip at the time of mounting or previously provide the electrode on the circuit board).

In the present invention, where each of the through-holes is filled with a conductive material for connecting the bare chip to be mounted to the circuits located below the metallic foil, the though-hole can be used to provide the electrodes of a conductive material on the circuit board.

In the present invention, if the conductive material is solder, the electrodes made of solder can be easily provided in the though-holes.

In the present invention, if the metallic foil has a low thermal expansion coefficient of 10 ppm/° C. or lower at 20–250° C., such a metallic foil permits a difference in the thermal expansion coefficient between the bare chip and the circuit board to be relaxed and minimizes stress to be produced in an electrically connecting portion, the flip-chip mounting can be implemented with a high degree of reliability.

In the present invention, where the metallic foil is made of an Fe/Ni alloy containing Ni of 31–50 weight % and having a thickness of 10–100 $\mu$m, this metallic foil can suppress a difference in the thermal expansion coefficient between the bare chip and the circuit board, thus providing excellent reliability of connection.

In the present invention, where the metallic foil is located in the area wider than the range where the pads of the bare chip to be mounted are formed, the metallic foil can surely give the effects of protecting the circuits on the circuit board and suppressing a difference in the thermal expansion coefficient between the bare chip and the circuit board.

Features and advantages of the invention will be evident from the following detailed description of the preferred embodiments described in conjunction with the attached drawings.

DETAILED DESCRIPTION OF THE PREFERRED EMBODIMENTS

A detailed explanation will be given of the present invention.

The circuit board according to the present invention may be a glass epoxy board, its laminated board, a build-up board including the glass epoxy board as a core board, a flexible circuit board with a circuit pattern formed on a polyimide film and its laminated board.

The insulating layer used in the present invention may be made of thermosetting resin such as epoxy resin, thermoplastic resin such as polyetherimide, phenoxy resin, etc, polyimide resin or these compounds.

The metallic foil used in the present invention may be made of copper (Cu), aluminum (Al), iron (Fe), nickel (Ni), chromium (Cr) or their alloy. Particularly, in order to suppress a difference in the thermal expansion coefficient between a bare chip and a circuit board, a metallic material having a low thermal coefficient of 10 ppm/° C. or lower (20–250° C.) is preferably adopted. An Fe/Ni alloy is one of the metallic materials having the low thermal expansion property. This alloy has different thermal expansion coefficients which mainly depend on the composition ratio of Fe and Ni. In the present invention, Ni content is set in a range of 31–50% by weight, preferably in a range of 31–45% by weight. The Ni content larger or smaller than such a range increases the thermal expansion coefficient. This makes it impossible to suppress the difference in the thermal expansion coefficient.

The thickness of the metallic foil having the low thermal expansion property is set in a range of 10–100 $\mu$m, preferably 10–70 $\mu$m or more preferably 10–50 $\mu$m. The foil thickness smaller than such a range makes it impossible to suppress the difference in the thermal expansion coefficient between the bare chip and circuit board. Inversely, the foil thickness larger than such a range makes it impossible to form minute holes each having a diameter not larger than 200 $\mu$m and degrades the reliability of connection.

An explanation will be given of a procedure for making a circuit board for mounting a bare chip according to the present invention.

Figure 1:
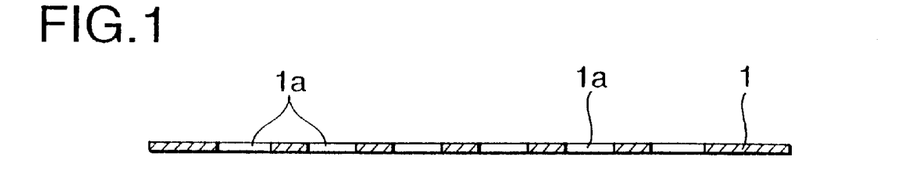
FIG. 1 a view for explaining the method of manufacturing a circuit board for mounting a bare chip according to the present invention.
Figure 2:
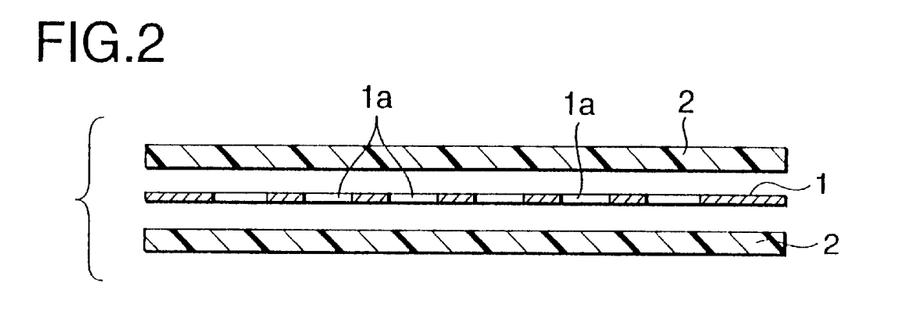
FIG. 2 is a view for explaining the method of manufacturing the above circuit board for mounting a bare chip.
Figure 3:
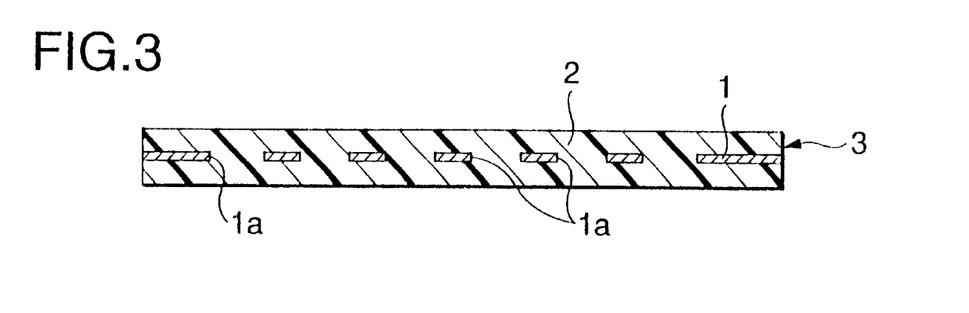
FIG. 3 is a view for explaining the method of manufacturing the above circuit board for mounting a bare chip.
Figure 4:
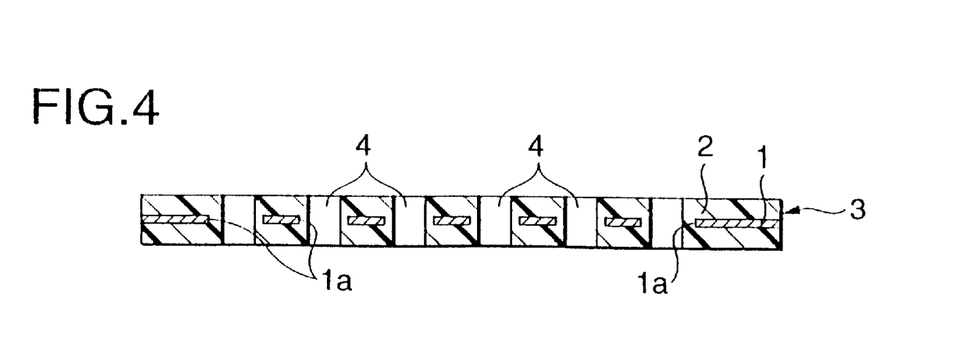
FIG. 4 is a view for explaining the method of manufacturing the above circuit board for mounting a bare chip.
Figure 5:
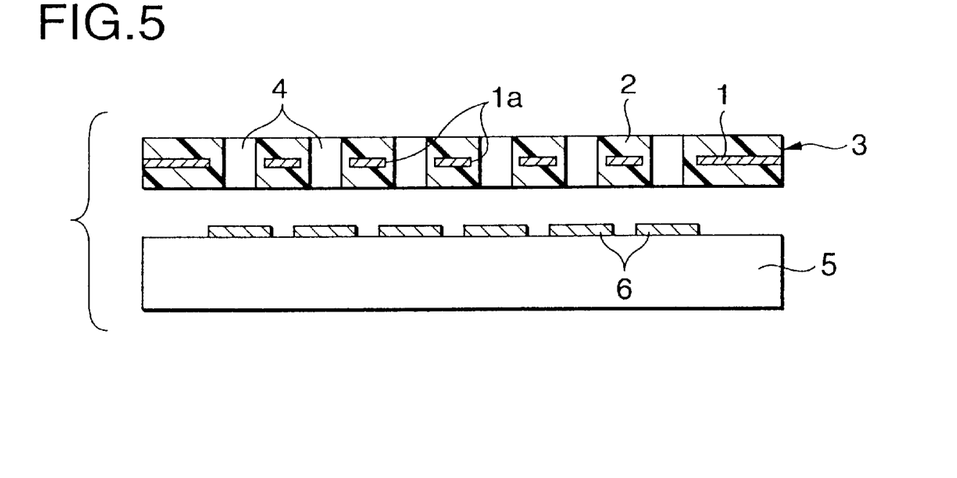
FIG. 5 is a view for explaining the method of manufacturing the above circuit board for mounting a bare chip.
Figure 6:
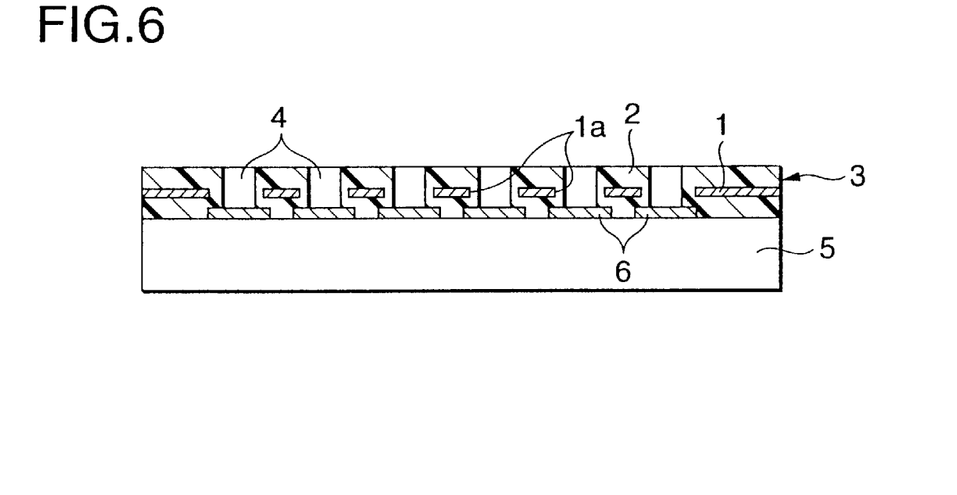
FIG. 6 is a view for explaining the method of manufacturing the above circuit board for mounting a bare chip.
Figure 7:
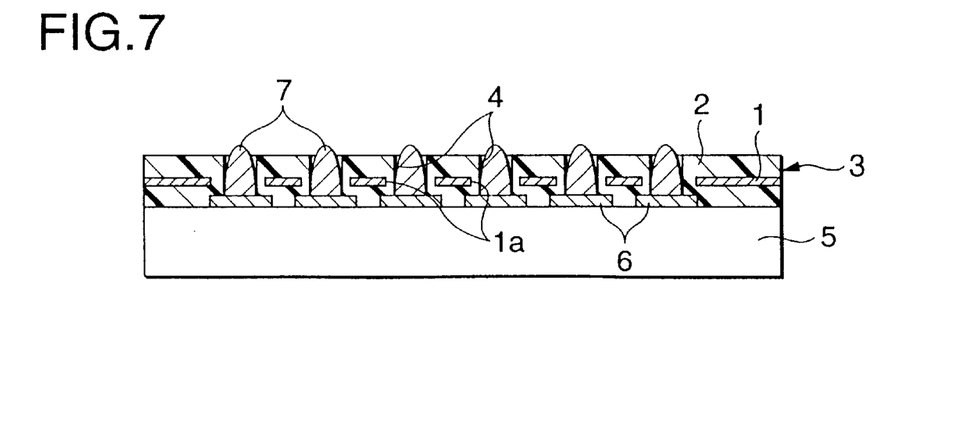
FIG. 7 is a view for explaining the method of manufacturing the above circuit board for mounting a bare chip.

First, as shown in FIG. 1, a metallic foil 1 is prepared which has a large number of through-holes 1a corresponding to pads of a bare chip to be mounted. As shown in FIG. 2, two bonding sheets 2 (corresponding to the insulating layers in the present invention) are superposed on the metallic foil 1 from both sides and heated under pressure. Thus, a substrate 3 in which both surfaces of the metallic foil 1 are covered with the bonding sheets 2 is made (FIG. 3). As shown in FIG. 4, at the portions of the substrate 3 corresponding to the respective through-holes 1a, through-holes 4 which are smaller than the through-holes 1a are made. Thereafter, as shown in FIG. 5, a circuit board 5 with circuits 6 formed on its surface and the substrate 3 are superposed in their alignment and heated under pressure so that they are thermally bonded to each other. Thus, a circuit board for mounting a bare chip as shown in FIG. 6 can be manufactured. Additionally, as shown in FIG. 7, conductive bumps 7 can be formed within the through-holes 4 made in the substrate 3. These conductive bumps 7 are used for electric connection between the circuits and the bare chip to be mounted.

The technique for making through-holes 1a and 4 in the metallic foil 1 or the substrate 3 may be punching, drilling, wet etching, laser, etc. The conductive material for the conductive bump may be conductive Ag paste or conductive Cu paste. The bump can be formed by printing the conductive material so that it is hardened. The conductive material is preferably solder. The solder bump can be formed by electrolytic plating, "re-flowing" after the printing of the solder paste, or "re-flowing" with a solder ball located on a flux applied electrode.

Figure 12:
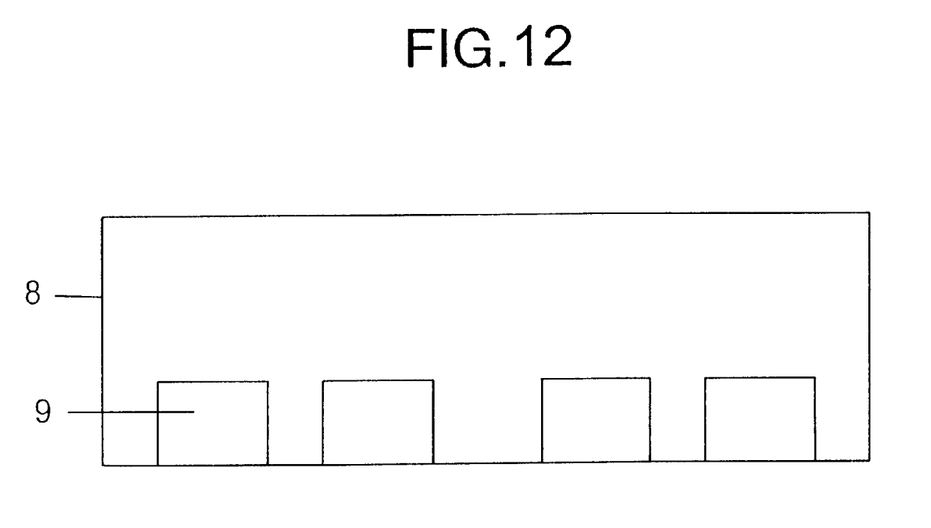
FIG. 12 is a view showing the detail of the pads of an individual bare chip.

The metallic foil is provided in a larger area than the range where the pads of the bare chip to be mounted are formed. In the circuit board on which a plurality of bare chips are mounted, like a multi-chip module (MCM), different metallic foils 1 may be arranged to correspond to the positions where individual bare chips 8 having pads 9 are mounted (FIG. 8), otherwise the metallic foil 1 may be arranged in the entire substrate FIG. 12 illustrates the detail of the pads 9 of an individual bare chip 8.

If there is a problem of warping of the circuit board 1 in the above manufacturing method, another metallic foil 1 may be arranged on the back surface of the circuit board 5. Further, the solder bumps formed on the side of the bare chip may be aligned with and bonded/loaded within the through-holes 4 of circuit board 5 as shown in FIG. 6. The procedure of making the circuit board for mounting the bare chip should not be limited to the technique described above.

Now referring to the drawings, an explanation will be given of the embodiments of the present invention.

Figure 8:
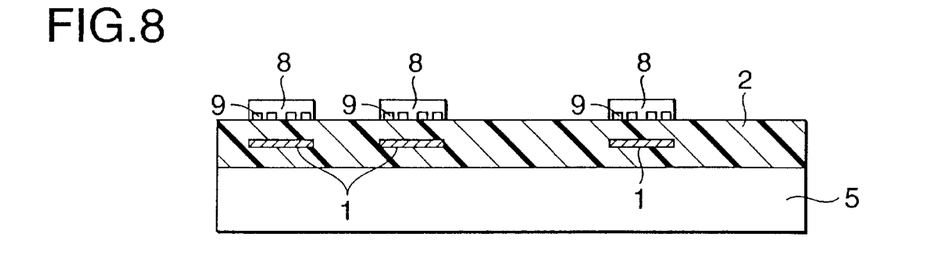
FIG. 8 is a view for explaining the range where a metallic foil is arranged.
Figure 9:
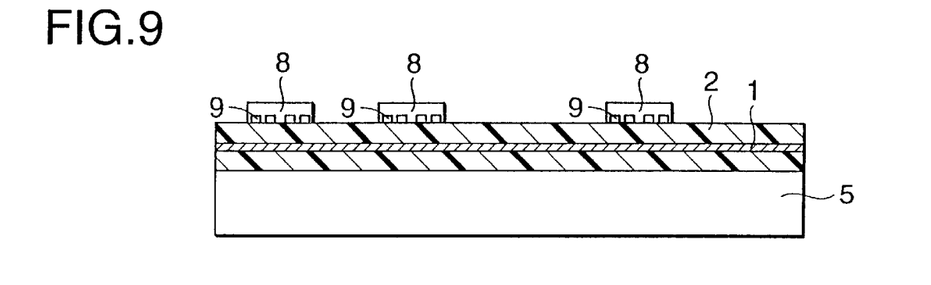
FIG. 9 is a view for explaining the range where the above metallic foil is arranged.
Figure 10:
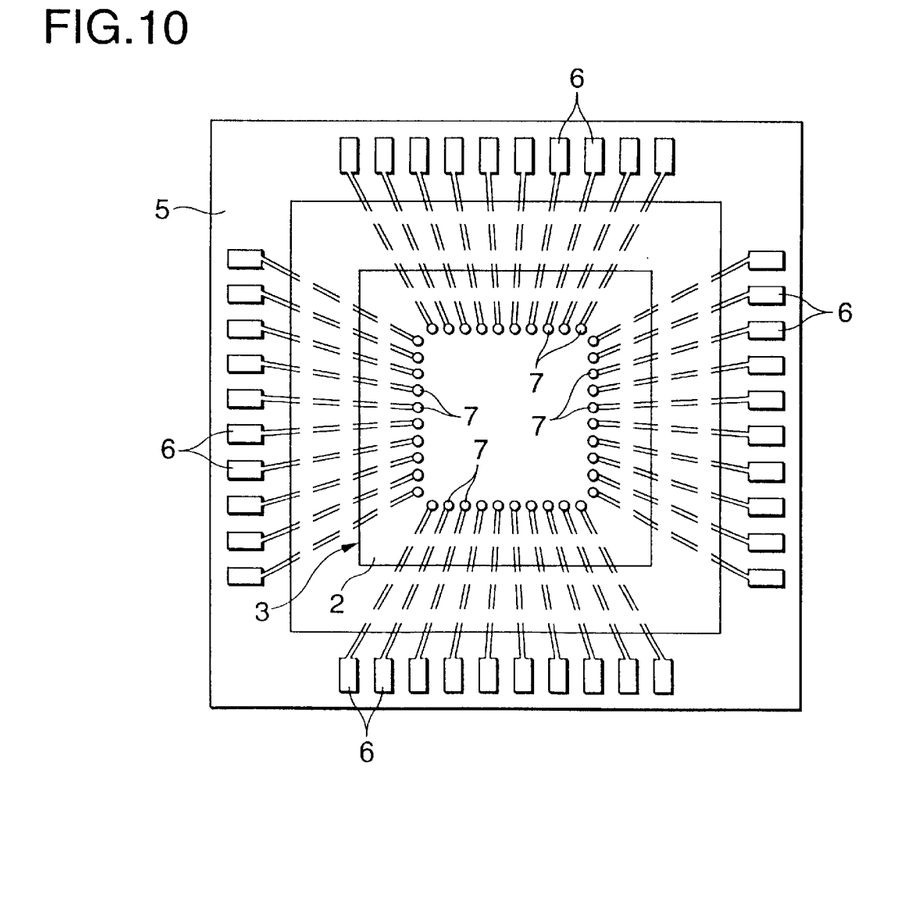
FIG. 10 is a plan view showing an embodiment of the above circuit board for mounting a bare chip according to the present invention.

FIG. 10 shows an embodiment of a circuit board for mounting a bare chip according to the present invention. In FIG. 10, reference numeral 5 denotes a glass epoxy board on one surface of which circuits 6 are formed. Reference numeral 3 denotes a substrate bonded to the surface of the glass epoxy board 5 on which the circuits 6 are formed. The substrate 3 is composed of a Fe/Ni alloy foil 1 and bonding sheets (insulating layers) 2 covering both surfaces of the alloy foil 1 (FIG. 3). The substrate 3 is arranged in an area larger than the range where the pads of the bare chips to be mounted are formed (FIG. 8). Reference numeral 7 denotes one of solder bumps formed with a large number of through-holes 4 made in the substrate 3 (FIG. 7).

The above circuit board for mounting a bare chip can be manufactured as follows. First, a large number of through-holes 1a are made in the Fe/Ni alloy foil 1 using a drill (FIG. 1). Next, polyimide bonding sheets 2 are bonded to both surfaces of the Fe/Ni alloy 1 by heating under pressure, thereby providing the substrate 3 (FIG. 3). At the positions of the substrate 3 corresponding to the respective through-holes 1a, through-holes 4 each having a smaller diameter than that of each of the through-holes 1a are punched (FIG. 4). Thereafter, the substrate 3 is bonded in alignment to the surface of the glass epoxy board on which the circuits 6 are formed by heating under pressure. The solder paste is printed on each of the through-holes 4 of the substrate 3, and is subjected to "re-flow" within a nitrogen atmosphere at a predetermined temperature. After flux is cleaned, the solder bumps 7 are formed. In this way, the circuit board for mounting a bare chip as shown in FIG. 10 can be manufactured.

In the embodiment described above, since the circuits 6 are protected by the Fe/Ni alloy foil 1, the circuits 6 will not be cut halfway when the bare chip mounted once is repaired. The Fe/Ni alloy 1, which has a low thermal expansion coefficient, permits a difference in the thermal expansion coefficient between the bare chip 8 and the glass epoxy board 5 to be reduced, thereby minimizing the stress occurring in the solder bumps 7.

An explanation will be given of concrete embodiments in comparison to various comparative examples.

Embodiment 1

Through-holes 1a each having a diameter of 300 µm are made at a pitch of 500 µm in an Fe/Ni alloy foil 1 (Ni content of 36 weight % and thermal expansion coefficient of 1.5 ppm/° C.) having a thickness of 50 µm and a square of 20 mm (FIG. 1). Polyimide sheets 2 (SPB-035 available from SINNITTETU KAGAKU CORP) are bonded onto both surfaces of the Fe/Ni alloy foil 1 by heating under pressure (30 minutes at 180° C. under 30 kg/cm$^2$) (FIG. 3). Through-holes 4 each having a diameter of 200 µm are made again at the same positions as the through-holes 1a. The substrate 3 thus formed is bonded in alignment to the surface of the glass epoxy board 5 (FR-4) on which circuits 6 are formed by heating under pressure (1 hour at 200° C. under 40 kg/cm$^2$) (FIG. 6).

Embodiment 2

In the sample produced in the same manner as in Embodiment 1, for connection to a bare chip, solder paste (Sn 8RA-3AMQ having a melting point of 260° C. available from NIHON SUPERIA CORP) is printed within each of the through-holes 4 each having a diameter of 200 µm. After its "re-flow" in a nitrogen atmosphere at 230° C., flux is cleaned to form the solder bumps (FIGS. 7 and 10).

Embodiment 3

In place of the alloy foil 1 in Embodiment 1, an Fe/Ni alloy foil (Ni content of 36 weight % and thermal expansion coefficient of 1. 5 ppm/° C.) having a thickness of 100 µm and a square of 20 mm was adopted.

Embodiment 4

In place of the alloy foil 1 in Embodiment 1, an Fe/Ni alloy foil (Ni content of 36 weight % and thermal expansion coefficient of 1.5 ppm/° C.) having a thickness of 10 µm and a square of 20 mm was adopted.

Embodiment 5

In place of the glass epoxy board 5 in Embodiment 1, a polyimide flexible board was adopted, and on the surface opposite to the surface on which the circuits 6 are formed, an Fe/Ni alloy foil having a thickness of 50 µm and a square of 20 mm was adopted.

Comparative Example 1

In Embodiment 1, without using the alloy foil 1, a polyimide bonding sheet 2 with punched through-holes 4 each having a diameter of 200 µm (SPB-035 available from SINNITTETU KAGAKU CORP) are bonded in alignment onto the surface of the glass epoxy board 5 (FR-4) on which circuits 6 are formed by heating under pressure (1 hour at 200° C. under 40 kg/cm$^2$).

Comparative Example 2

In place of the alloy foil 1 in Embodiment 1, an Fe/Ni alloy foil (Ni content of 36 weight % and thermal coefficient of 1.5 ppm/° C.) having a thickness of 5 µm and a square of 20 mm was adopted.

Comparative Example 3

In place of the alloy foil 1 in Embodiment 1, an Fe/Ni alloy foil (Ni content of 36 weight % and thermal coefficient of 1.5 ppm/° C.) having a thickness of 200 µm and a square of 20 mm was adopted.

Comparative Example 4

Figure 11:
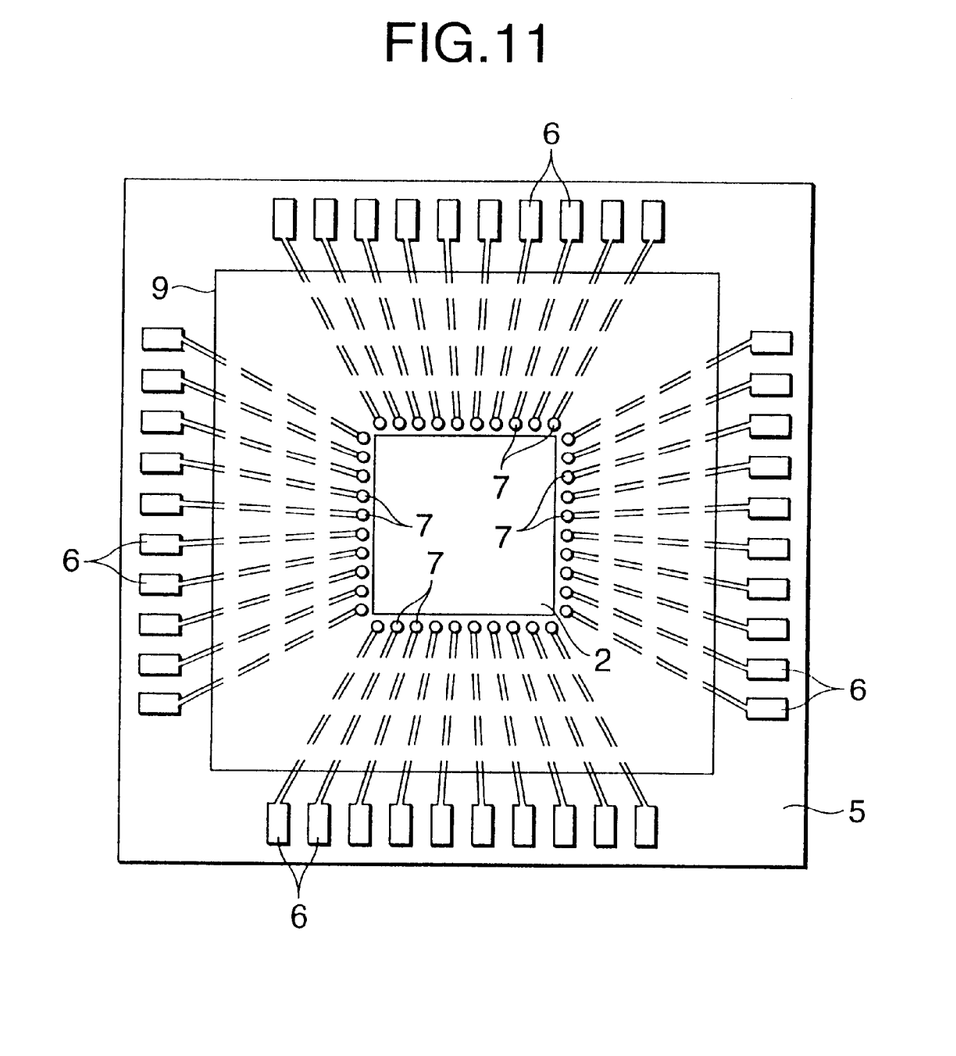
FIG. 11 is a plan view showing a comparative example.

Polyimide bonding sheets 2 (SPB-035 available from SINNITTETU KAGAKU CORP) are bonded to both surfaces of the Fe/Ni alloy foil 1 (Ni content of 36 weight % and thermal coefficient of 1.5 ppm/° C.) having a thickness of 50 µm and a square of 8 mm (enough to fit within the tip of a circuit conductor constituting circuits 6 on the glass epoxy board 5) by heating under pressure (30 minutes at 180° C. under 30 kg/cm$^2$). Thereafter, through-holes (not shown) each having a diameter of 200 µm were punched in the composite substrate thus formed. Thereafter, the substrate is bonded in alignment to the surface of the glass epoxy board on which the circuits 6 are formed by heating under pressure (1 hour at 200° C. under 40 kg/cm$^2$). The solder paste (Sn8RA-3AMQ having a melting point of 260° C. available from NIHON SUPERIA CORP) is printed on each of the through-holes each having a thickness of 200 µm of the substrate, and is subjected to "re-flow" within a nitrogen atmosphere at 230° C. After flux is cleaned, the solder bumps 7 are formed (FIG. 11).

On the circuit board manufactured in Embodiments 1, 3–5 and Comparative Examples 1–4, a silicon chip of 10 mm square with solder bumps each having a diameter of 100 µm formed at a pitch of 500 µm is mounted in the form of a flip-chip using epoxy under-fill material (3561 available for NIPPON ROKKUTAITO CORP). In Embodiment 2, another silicon chip of 10 mm square with stud bumps of Au is mounted in the form of a flip chip using the epoxy under-fill material (3561 available for NIPPON ROKKUTAITO CORP).

Of these products according to Embodiments 1–5 and Comparative examples 1–4, the product according to Comparative Example 1 in which the alloy foil 1 is not provided immediately under the bare chip is in danger of that the circuits on the circuit board may be cut or damaged halfway when the bare chip is repaired. It is apparent that the other products in which the alloy foil 1 is provided immediately under the bare chip are excellent in the workability of repairing.

Further, the products according to Embodiments 1–5 and Comparative Examples 1–4 in which the bare chip is mounted in the form of a flip chip were subjected to a temperature shock test to test conduction between the circuit board and bare chip, one cycle of the temperature shock test is as follows: the product was left at a temperature of −65° C. for 10 minutes and was left at a temperature at a temperature of 125° C. for 10 minutes. The test results are shown in Table 1.

TABLE 1

|  | Initial conduction | Conduction after 500 cycles | Conduction after 1000 cycles |
| --- | --- | --- | --- |
| Embodiment 1 | all pins conductive | all pins conductive | All pins conductive |
| Embodiment 2 | all pins conductive | all pins conductive | All pins conductive |
| Embodiment 3 | all pins conductive | all pins conductive | All pins conductive |
| Embodiment 4 | all pins conductive | all pins conductive | All pins conductive |
| Embodiment 5 | all pins conductive | all pins conductive | All pins conductive |
| Comparative Example 1 | all pins conductive | 50% poor conduction | 80% poor conduction |
| Comparative Example 2 | all pins conductive | 10% poor conduction | 15% poor conduction |
| Comparative Example 3 | 15% poor conduction | 15% poor conduction | 15% poor conduction |
| Comparative Example 4 | all pins conductive | 5% poor conduction | 8% poor conduction |

As shown in FIG. 1, in the products according to Embodiments 1–5, all pins were conductive in the initial conduction, conduction after 500 cycles and conduction after 1000 cycles. On the other hand, in the products according to Comparative Examples 1, 2 and 4, poor conduction occurs in the conduction after 500 cycles and 1000 cycles. In the product according to Comparative Example 3, poor conduction occurs in the initial conduction, conduction after 500 cycles and conduction after 1000 cycles. It is understood that the products according to Embodiments 1–5 are more excellent than that according to Comparative Examples 1–4 in reliability in conduction.

As described above, in the circuit board for mounting a bare chip according to the present invention, since a metallic foil for protecting circuits is provided through an insulating layer at the area where the bare chip is located, the circuits on the circuit board can be protected by the metallic foil. For this reason, there is no fear of damaging the circuit when the bare chip is repaired. In addition, the reliability of conduction when the bare chip is directly mounted in the form of a flip chip on the circuit board can be greatly improved.

In the present invention, where through-holes are formed at predetermined positions of the metallic foil and the inner periphery of each of the through-holes is covered with an insulating material, these through-holes can be used as a space for electrically connecting the bare chip to be mounted to the circuits located below the metallic foil (which is used to insert an electrode provided on the bare chip at the time of mounting or previously provide the electrode on the circuit board).

In the present invention, where each of the through-holes is filled with a conductive material for connecting the bare chip to be mounted to the circuits located below the metallic foil, the though-hole can be used to provide the electrodes of a conductive material on the circuit board.

In the present invention, if the conductive material is solder, the electrodes made of solder can be easily provided in the though-holes.

In the present invention, if the metallic foil has a thermal expansion coefficient of 10 ppm/° C. or lower at 20–250° C., the low thermal expansion property of this metallic foil permits a difference between the bare chip and the circuit board to be relaxed and minimizes stress to be produced in an electrically connecting portion, the flip-chip mounting can be implemented with a high degree of reliability.

In the present invention, where the metallic foil is made of an Fe/Ni alloy containing Ni of 31–50 weight % and having a thickness of 10–100 μm, this metallic foil can suppress a difference in the thermal expansion coefficient between the bare chip and the circuit board, thus providing excellent reliability of connection.

In the present invention, where the metallic foil is located in the area wider than the range where the pads of the bare chip to be mounted are formed, the metallic foil can surely give the effects of protecting the circuits on the circuit board and suppressing a difference in the thermal expansion coefficient between the bare chip and the circuit board.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A semiconductor device including a bare chip in a form of a flip chip and a circuit board for mounting said bare chip, comprising:
  a circuit; and
  a single metallic foil for protecting said circuit, said single metallic foil being arranged in an area where said bare chip is mounted with said single metallic foil being insulated from said circuit by an insulating layer;
  wherein said single metallic foil is an undivided layer at least in said area where said bare chip is mounted,
  wherein through-holes are formed at predetermined positions in said single metallic foil and an inner periphery of at least one of said through-holes is covered with an insulating material, and
  wherein said bare chip, said circuit and said circuit board directly contact said insulating layer.

2. A semiconductor device according to claim 1, wherein said through-hole of said single metallic foil is filled with a conductive material for connecting said bare chip to said circuit, wherein said bare chip is located above said single metallic foil and said circuit is located below said single metallic foil.

3. A semiconductor device according to claim 2, wherein said conductive material is solder.

4. A semiconductor device according to claim 1, wherein said single metallic foil has a thermal expansion coefficient of 10 ppm/° C. or lower at 20–250° C.

5. A semiconductor device according to claim 4, wherein said single metallic foil consists essentially of an Fe/Ni alloy containing Ni of 31–50 weight % and having a thickness of 10–100 μm.

6. A semiconductor device according to claim 1, wherein said single metallic foil is arranged in an area at least as great as a mounting area of said bare chip.

7. A semiconductor device according to claim 1, wherein said metallic foil consists essentially of an Fe/Ni alloy containing Ni of 31–50 weight % and having a thickness of 10–100 μm.

8. A semiconductor device including a bare chip in a form of a flip chip and a circuit board for mounting said bare chip, comprising:
  a circuit board;
  a circuit formed on said circuit board;

a single metallic foil;

an insulating layer superposed on said circuit and said circuit board, said insulating layer covering both surfaces of said single metallic foil thereby insulating said single metallic foil from said circuit; and a plurality of through-holes penetrating through said insulating layer and said single metallic foil, wherein an inner periphery of at least one of said through-holes is covered with an insulating material of said insulating layer;

wherein said single metallic foil is arranged at least in an area where said bare chip is mounted, wherein said single metallic foil is an undivided layer at least in said area where said bare chip is mounted, and wherein said bare chip, said circuit and said circuit board directly contact said insulating layer.

9. A semiconductor device according to claim 8, further comprising a conductive material filling said through-hole so as to connect said bare chip to said circuit, wherein said bare chip is located above said single metallic foil and said circuit is located below said single metallic foil.

10. A semiconductor device according to claim 9, wherein said conductive material is solder.

11. A semiconductor device according to claim 8, wherein said single metallic foil has a thermal expansion coefficient of 10 ppm/° C. or lower at 20–250° C.

12. A semiconductor device according to claim 11, wherein said single metallic foil consists essentially of an Fe/Ni alloy containing Ni of 31–50 weight % and having a thickness of 10–100 μm.

13. A semiconductor device according to claim 8, wherein said single metallic foil is arranged in an area at least as great as a mounting area of said bare chip.

14. A semiconductor device according to claim 8, wherein said single metallic foil consists essentially of an Fe/Ni alloy containing Ni of 31–50 weight % and having a thickness of 10–100 μm.

15. A semiconductor device including a bare chip in a form of a flip chip and a circuit board for mounting said bare chip, comprising:

a circuit formed on said circuit board; and a single metallic foil for protecting said circuit, said single metallic foil being arranged to correspond to a mounting area of said bare chip and having an area substantially corresponding in size with said mounting area of said bare chip, wherein said single metallic foil is an undivided layer at least in said mounting area, wherein said single metallic foil is insulated from said circuit by an insulating layer, and wherein said bare chip, said circuit and said circuit board directly contact said insulating layer.

16. A semiconductor device according to claim 15, wherein a through-hole is formed at a predetermined position in said single metallic foil and an inner periphery of said through-hole is covered with an insulating material.

17. A semiconductor device according to claim 16, wherein said through-hole of said single metallic foil is filled with a conductive material for connecting said bare chip to said circuit, wherein said bare chip is located above said single metallic foil and said circuit is located below said single metallic foil.

18. A semiconductor device according to claim 17, wherein said conductive material is solder.

19. A semiconductor device according to claim 15, wherein said single metallic foil has a thermal expansion coefficient of 10 ppm/° C. or lower at 20–250° C.

20. A semiconductor device according to claim 10, wherein said single metallic foil consists essentially of an Fe/Ni alloy containing Ni of 31–50 weight % and having a thickness of 10–100μm.

21. A semiconductor device according to claim 15, wherein said single metallic foil is arranged in an area wider than a range where pads of said bare chip to be mounted are formed.

22. A semiconductor device according to claim 15, wherein said single metallic foil consists essentially of an Fe/Ni alloy containing Ni of 31–50 weight % and having a thickness of 10–100μm.

* * * * *